(12) United States Patent
Miskin et al.

(10) Patent No.: US 8,148,905 B2
(45) Date of Patent: *Apr. 3, 2012

(54) AC LIGHT EMITTING DIODE AND AC LED DRIVE METHODS AND APPARATUS

(75) Inventors: Michael Miskin, Sleepy Hollow, IL (US); James Anderson, Elmwood Park, IL (US)

(73) Assignee: Lynk Labs, Inc., Elgin, IL (US)

( * ) Notice: Subject to any disclaimer, the term of this patent is extended or adjusted under 35 U.S.C. 154(b) by 150 days.

This patent is subject to a terminal disclaimer.

(21) Appl. No.: 12/364,890

(22) Filed: Feb. 3, 2009

(65) Prior Publication Data

US 2009/0167202 A1    Jul. 2, 2009

Related U.S. Application Data

(63) Continuation of application No. 11/066,414, filed on Feb. 25, 2005, now Pat. No. 7,489,086.

(60) Provisional application No. 60/547,653, filed on Feb. 25, 2004, provisional application No. 60/559,867, filed on Apr. 6, 2004.

(51) Int. Cl.
*H05B 37/00* (2006.01)

(52) U.S. Cl. ............... 315/185 R; 315/187; 315/192; 315/210

(58) Field of Classification Search ........... 315/185 R, 315/210, 224, 225, 226, 291, 187, 192
See application file for complete search history.

(56) References Cited

U.S. PATENT DOCUMENTS

| | | | |
|---|---|---|---|
| 3,869,641 | A | 3/1975 | Goldberg |
| 4,218,627 | A | 8/1980 | Kiesel |
| 4,298,869 | A | 11/1981 | Okuno |
| 5,699,218 | A | 12/1997 | Kadah |
| 5,790,013 | A | 8/1998 | Hauck |
| 6,614,103 | B1 | 9/2003 | Durocher et al. |
| 7,489,086 | B2 | 2/2009 | Miskin et al. |
| 2003/0043611 | A1 | 3/2003 | Bockle et al. |
| 2003/0122502 | A1 | 7/2003 | Clauberg et al. |
| 2003/0169014 | A1 | 9/2003 | Kadah |
| 2003/0175004 | A1 | 9/2003 | Garito et al. |
| 2004/0183380 | A1 | 9/2004 | Otake |
| 2006/0038542 | A1 | 2/2006 | Park et al. |

FOREIGN PATENT DOCUMENTS

| | | |
|---|---|---|
| EP | 1 215 944 A1 | 6/2002 |
| JP | 08137429 A  * | 5/1996 |
| JP | 11-330561 A1 | 11/1999 |

OTHER PUBLICATIONS

Fukushima et al, Display Device, Translation of JP-08137429A, May 1996.*

* cited by examiner

*Primary Examiner* — David Hung Vu
(74) *Attorney, Agent, or Firm* — Factor Intellectual Property Law Group, Ltd.

(57) ABSTRACT

An AC LED package and circuits are disclosed along with an AC LED driver. The AC LED circuit may include as few as one LED or an array of anti-parallel LEDs driven with AC power sources and AC LED drivers at various voltages and frequencies. The AC LEDs are pre-packaged in various forms and materials and designed for mains or high frequency coupling in various forms to AC power sources, inverter type drivers or packages. The AC LED driver is a fixed frequency driver that provides a relatively constant voltage output to different size loads within the wattage limitation of the driver and in some cases is a direct mains power source.

16 Claims, 18 Drawing Sheets

AC VOLTAGE REGULATOR WITH VOLTAGE MEASUREMENT

AC LIGHT EMITTING DIODE AND AC LED DRIVE METHODS AND APPARATUS

RELATED APPLICATIONS

The present application is a Continuation of U.S. application Ser. No. 11/066,414 filed Feb. 25, 2005, which is now U.S. Pat. No. 7,489,086, which claims priority to U.S. Provisional Application No. 60/547,653, filed Feb. 25, 2004 and U.S. Provisional Application No. 60/559,867, filed Apr. 6, 2004, all of which are incorporated herein by reference.

TECHNICAL FIELD

The present invention generally relates to light emitting diodes ("LEDs") and LED drivers. The present invention specifically relates to alternating current ("AC") driven LEDs, LED circuits and AC drive circuits and methods.

FEDERALLY SPONSORED RESEARCH OR DEVELOPMENT

None.

BACKGROUND OF THE INVENTION

1. Field of the Invention

The present invention generally relates to light emitting diodes ("LEDs") and LED drivers. The present invention specifically relates to alternating current ("AC") driven LEDs, LED circuits and AC drive circuits and methods.

2. Description of the Related Art

LEDs are semiconductor devices that produce light when a current is supplied to them. LEDs are intrinsically DC devices that only pass current in one polarity and historically have been driven by DC voltage sources using resistors, current regulators and voltage regulators to limit the voltage and current delivered to the LED. Some LEDs have resistors built into the LED package providing a higher voltage LED typically driven with 5V DC or 12V DC.

With proper design considerations LEDs may be driven more efficiently with AC than with DC drive schemes. LED based lighting may be used for general lighting, specialty lighting, signs and decoration such as for Christmas tree lighting. For example, U.S. Pat. No. 5,495,147 entitled LED LIGHT STRING SYSTEM to Lanzisera (hereinafter "Lanzisera") and U.S. Pat. No. 4,984,999 entitled STRING OF LIGHTS SPECIFICATION to Leake (hereinafter "Leake") describes different forms of LED based light strings. In both Lanzisera and Leake, exemplary light strings are described employing purely parallel wiring of discrete LED lamps using a step-down transformer and rectifier power conversion scheme. This type of LED light string converts input electrical power, usually assumed to be the common U.S. household power of 110 VAC, to a low voltage, rectified to nearly DC input.

Pat. Pending Application No. 0015968A1 entitled PREFERRED EMBODIMENT TO LED LIGHT STRING to Allen (hereinafter "Allen") discloses AC powered LED-based light strings. Allen describes LED light strings employing series parallel blocks with a voltage matching requirement for direct AC drive placing fundamental restrictions on the number of diodes (LEDs) on each diode series block, depending on the types of diodes used. Allen discloses that for the forward voltage to be "matched," in each series block, the peak input voltage must be less than or equal to the sum of the maximum forward voltages for each series block in order to prevent over-driving.

LEDs can be operated from an AC source more efficiently if they are connected in an "opposing parallel" configuration as shown by WO98/02020 and JP 11/330561. More efficient LED lighting systems can be designed using high frequency AC drivers as shown by Patent Publication Number 20030122502 entitled Light Emitting Diode Driver ("Clauberg et. al.") Clauberg et. al. discloses that higher frequency inverters may be used to drive an opposing parallel LED pair, an opposing parallel LED string and/or an opposing parallel LED matrix by coupling the LEDs to a high frequency inverter through a resonant impedance circuit that includes a first capacitor coupled in series to one or more inductors with the impedance circuit coupled in series to opposing parallel LEDs with each set of LEDs having a second series capacitor in series to the impedance circuit. In this system additional opposing parallel configurations of LEDs with capacitors may not be added to or removed from the output of the driver without effecting the lumens output of the previously connected LED circuits unless the driver or components at the driver and/or the opposing parallel LED capacitors were replaced with proper values. By adding or removing the opposing parallel LED circuits the voltage would increase or drop at the inductor and the current would increase or drop through the first series capacitor as the load changed therefore the inductor and all capacitors or entire driver would need to be replaced or adjusted each time additional LEDs were added to or removed from the system.

Patent application number US2004/0080941 entitled Light Emitting Diodes For High AC Voltage Operation And General Lighting discloses that a plurality of opposing parallel series strings of LEDs can be integrated into a single chip and driven with high voltage low frequency mains AC power sources as long as there are enough LEDs in each opposing parallel series string of LEDs to drop the total source voltage across the series LEDs within the chip. Patent numbers WO2004023568 and JP2004006582 disclose that a plurality of opposing parallel series strings or opposing parallel series matrix of LEDs can be integrated into a single chip and mounted on an insulating substrate and driven with a high drive voltage and low drive current as long as there are enough LEDs in each opposing parallel series string of LEDs to drop the total source voltage across the series LEDs within the chip. These patents and application disclose that for single chip or packaged LED circuits a plurality of opposing parallel series strings are required with the total number of LEDs in each series string needing to be equal to or greater than the AC voltage source in order to drop the total forward voltage and provide the required drive current when driven direct with low frequency AC mains power sources.

The present invention addresses the above-noted shortcomings of the prior art while providing additional benefits and advantages

SUMMARY OF THE INVENTION

According to one broad aspect of the invention a lighting system is provided having two or more LED circuits. Each LED circuit has at least two diodes connected to each other in opposing parallel relation, at least one of which such diodes is an LED. At least one capacitor is connected to and is part of each opposing parallel LED circuit. The capacitor has only one end connected to the opposing parallel LEDs. A driver is connected to the one or more LED circuits, the driver providing AC voltage and current to the one or more LED circuits.

The driver and the LED circuits form a driven circuit. The driver and the LED circuits are also configured such that LED circuits may be added to or subtracted (intentionally or by component failure) from the driven circuit:

(a) without significantly affecting the pre-determined desired output range of light from any individual LED; and, (b) without the need to: (i) change the value of any discrete component; or, (ii) to add or subtract any discrete components, of any of the pre-existing driven circuit components which remain after the change. In another embodiment of the invention at least one resistor is connected to and is part of each opposing parallel LED circuit noted above. The resistor is connected in series with the at least one capacitor.

According to another aspect of the invention LED circuit (sometimes referred to as an "AC LED") can comprise two opposing parallel LEDs, an opposing parallel LED string or an opposing parallel LED matrix having a capacitor in series to at least one junction of the connected opposing parallel configurations within a single chip, a single package, an assembly or a module.

When a real capacitor is connected in series in one or more lines between an LED and an AC power source, there is a displacement current through that capacity of magnitude: $I=2\pi fCV$. The capacitor in the LED circuits of the invention regulates the amount of current and forward voltage delivered to the one or more opposing parallel LEDs based on the voltage and frequency provided by the AC driver. Based on the number of LEDs in the LED circuit the opposing parallel connections provide two or more junctions for at least one series capacitor to be connected in series of at least one power connection lead. In some embodiments, LED circuits use a series resistor in addition to the capacitor providing an "RC" resistor capacitor network for certain LED circuit driver coupling that does not provide protection against surge currents to the LED circuits.

It should be noted that "package" or "packaged" is defined herein as an integrated unit meant to be used as a discrete component in either of the manufacture, assembly, installation, or modification of an LED lighting device or system. Such a package includes LED's of desired characteristics with capacitors and or resistors sized relative to the specifications of the chosen opposing parallel LED's to which they will be connected in series and with respect to a predetermined AC voltage and frequency.

Preferred embodiments of a package may include an insulating substrate whereon the LEDs, capacitors and or resistors are formed or mounted. In such preferred embodiments of a package the substrate will include electrodes or leads for uniform connection of the package to a device or system associated with an AC driver or power source. The electrodes, leads, and uniform connection may include any currently known means including mechanical fit, and/or soldering. The substrate may be such as sapphire, silicon carbide, galium nitride, ceramics, printed circuit board material, or other materials for hosting circuit components.

A package in certain applications may preferably also include a heat sink, a reflective material, a lens for directing light, phosphor, nano-chrystals or other light changing or enhancing substances. In sum, according to one aspect of the invention, the LED circuits and AC drivers of the present invention permit pre-packaging of the LED portion of a lighting system to be used with standardized drivers of known specified voltage and frequency output. Such packages can be of varied make up and can be combined with each other to create desired systems given the scalable and compatible arrangements possible with, and resulting from, the invention.

According to one aspect of the invention, AC driven LED circuits (or "driven circuits") permit or enable lighting systems where LED circuits may be added to or subtracted (either by choice or by way of a failure of a diode) from the driven circuit without significantly affecting the pre-determined desired output range of light from any individual LED and, without the need to: (i) change the value of any discrete component; or, (ii) to add or subtract any discrete components, of any of the pre-existing driven circuit components which remain after the change. During design of a lighting system, one attribute of the LEDs chosen will be the amount of light provided during operation. In this context, it should be understood that depending on the operating parameters of the driver chosen, the stability or range of the voltage and frequency of the driver will vary from the nominal specification based upon various factors including but not limited to, the addition or subtraction of the LED circuits to which it becomes connected or disconnected. Accordingly, as sometimes referred to herein, drivers according to the invention are described as providing "relatively constant" or "fixed" voltage and frequency. The extent of this relative range may be considered in light of the acceptable range of light output desired from the resulting circuit at the before, during, or after a change has been made to the lighting system as a whole. Thus it will be expected that a pre-determined range of desired light output will be determined within which the driven LED circuits of the invention will perform whether or not additional or different LED circuits have been added or taken out of the driven circuit as a whole.

According to another aspect of the invention and LED circuit may be at least one pre-packaged LED and one pre-packaged diode connected together opposing parallel of each other, two opposing parallel pre-packaged LEDs, an opposing parallel LED string of pre-packaged LEDs or an opposing parallel LED matrix of pre-packaged LEDs having a capacitor in series of at least one junction of the connected LED circuits. The LED circuit capacitor allows for direct coupling of at least one LED circuit to the LED driver without additional series components such as capacitors and/or inductors between the LED circuit driver and the LED circuits. The LED circuit driver provides a relatively fixed voltage and relatively fixed frequency AC output even with changes to the load using feedback AC voltage regulator circuitry. The LED circuit's may be directly coupled and scaled in quantity to the LED circuit driver without affecting the other LED circuit's lumen output as long as the LED circuit driver maintains a relatively fixed voltage and relatively fixed frequency AC output.

According to an aspect of the invention, an LED circuit driver provides a relatively fixed voltage and relatively fixed frequency AC output such as mains power sources. The LED circuit driver output voltage and frequency delivered to the LED circuit may be higher or lower than mains power voltage and frequencies by using an LED circuit inverter driver. The LED circuit inverter driver providing higher frequencies is required for LED circuits that are integrated into small form LED packages that include integrated capacitors or resistor capacitor "RC" networks. The LED circuit inverter driver has feedback circuitry such as a resistor divider network or other means allowing it to sense changes to the load and re-adjust the frequency and/or voltage output of the LED circuit driver to a desired relatively fixed value. The LED circuit driver may also provide a soft-start feature that reduces or eliminates any surge current from being delivered to the LED circuit when the LED circuit driver is turned on. Higher frequency and lower voltage LED circuit inverter drivers are preferred enabling smaller package designs of LED circuits as the capacitor at higher frequencies would be reduced in size making it easier to integrate into a single LED circuit chip, package, assembly or module.

According to the invention LED circuits may have a resistor capacitor ("RC") network connected together in series or separate to the connected junction or junctions of the LED circuits. The maximum resistor value needed is only that value of resistance needed to protect the one or more LEDs within the LED circuit from surge currents that may be delivered by LED circuit drivers that do not provide soft start or other anti surge current features. Direct mains power coupling would require RC network type LED circuits as the mains power source delivers surge currents when directly coupled to an LED circuit.

The higher frequency LED circuit inverter driver may be a halogen or high intensity discharge (HID) lamp type driver with design modifications for providing a relatively fixed voltage and relatively fixed frequency output as the LED circuit load changes. Meaning if the LED circuit inverter driver is designed to have an output voltage of 12V at a frequency of 50 Khz the LED circuit driver would provide this output as a relatively constant output to a load having one or more than one LED circuits up to the wattage limit of the LED circuit driver even if LED circuits were added to or removed from the output of the LED circuit driver.

The higher frequency inverter having a relatively fixed voltage and relatively fixed frequency output allows for smaller components to be used and provides a known output providing a standard reference High Frequency LED circuit driver enabling LED circuits to be manufactured in volume in existing or reasonably similar LED package sizes with integrated capacitors or RC networks based on the number of LEDs desired in the LED circuit package.

Patent publication number 20030122502 entitled Light Emitting Diode driver (Clauberg and Erhardt) does not disclose the use of a high frequency inverter driver having a means or keeping a relatively fixed voltage and relatively frequency in response to changes in the load. According to the present invention described herein, by not having additional components such as an inductor or capacitor in series between the LED circuit and the LED circuit driver one LED circuit at a time may be added to or removed from the LED circuit driver output without having to change any components, the LED circuit driver or make adjustments to the LED circuit driver. Additionally, according to this invention the lumen output of the existing LED circuits stays relatively constant due to the self-regulating nature of each individual LED circuit when driven with the relatively fixed frequency and voltage of the LED circuit driver. This level of scalability, single chip LED circuit packaging and standardization is not possible with the prior art using an inductor in series between the LEDs or other components due to the voltage or current increase or drop across the inductors and capacitors in response to changes in the load.

Prior art for single chip LED circuits, for example those disclosed in 02004023568 and JP2004006582 do not provide a way to reduce the number of LEDs within the chip below the total forward voltage drop requirements of the source. The present invention however, enables an LED circuit to be made with any number of LEDs within a single chip, package or module by using capacitors or RC networks to reduce the number of LEDs needed to as few as one single LED. Improved reliability, integration, product and system scalability and solid state lighting design simplicity may be realized with LED circuits and the LED circuit drivers. Individual LED circuits being the same or different colors, each requiring different forward voltages and currents may be driven from a single source LED circuit driver. Each individual LED circuit can self-regulate current by matching the capacitor or RC network value of the LED circuit to the known relatively fixed voltage and frequency of the LED circuit driver whether the LED circuit driver is a mains power source, a high frequency LED circuit driver or other LED circuit driver capable of providing a relatively fixed voltage and relatively fixed frequency output.

This again is premised upon the fact that when a real capacitor is connected in series in one or more lines between an LED and an AC power source, there is a displacement current through that capacity of magnitude: $I=2\pi fCV$. This means that one can predetermine the amount of current to be delivered through a capacitance based upon a known voltage and frequency of an AC source.

According to other aspects of the invention, the LED circuit driver may be coupled to a dimmer switch that regulates voltage or frequency or may have integrated circuitry that allows for adjustability of the otherwise relatively fixed voltage and/or relatively fixed frequency output of the LED circuit driver. The LED circuits get brighter as the voltage and/or frequency of the LED circuit driver output is increased to the LED circuits.

One form of the invention is at least one LED and one diode connected together opposing parallel of each other, two opposing parallel LEDs, an opposing parallel LED string and/or opposing parallel LED matrix having a capacitor in series of at least one connected junction of the connected opposing parallel LED configurations within a single chip, a single package, an assembly or a module. The LED circuit with capacitor may be placed on an insulating substrates such as but not necessarily ceramic or sapphire and/or within various LED package sizes; materials and designs based of product specifications or assembled on printed circuit board material. The integrated LED circuit capacitor is of a predetermined value enabling the LED circuit to self-regulate a reasonably constant and specific current when coupled to an LED circuit driver that provides a relatively fixed voltage and frequency output. The LED circuit capacitor may be of a value needed to provide the typical operating voltage and current of the LED circuit when designed for coupling to a specific LED circuit driver.

Another form of the invention is an LED circuit comprising at least one LED and one diode connected together opposing parallel of each other, two opposing parallel LEDs, an opposing parallel LED string and/or opposing parallel LED matrix having a series resistor capacitor ("RC") network connected together in series or independently in series between at least one connected junction of the opposing parallel LEDs and the respective power connection of the LED circuit. The opposing parallel LEDs and RC network may be placed on an insulating substrate such as but not necessarily ceramic or sapphire and/or within various LED package sizes; materials and designs based of product specifications or assembled on printed circuit board material. The LED circuit RC network may be of a value needed to provide the typical operating voltage and current of the LED circuit when designed for coupling to a specific LED circuit driver.

Another form of the invention is an LED circuit comprising a matrix of two opposing parallel LEDs connected together in parallel with every two opposing parallel LEDs having an individual capacitor in series to the power source connection. The entire parallel array of opposing parallel LED circuits including capacitors may be may be placed on an insulating substrate such as but not necessarily ceramic or sapphire and/or within various LED package sizes; materials and designs based of product specifications or assembled on printed circuit board material. The opposing parallel matrix of LED circuits integrated in the LED circuit package may be RC network type LED circuits.

Another form of the invention is an LED circuit comprising a matrix of opposing parallel LEDs connected together in parallel with every set of opposing parallel LEDs having an individual RC network in series to the power connection lead.

Another form of the invention is an LED circuit comprising a matrix of opposing parallel LEDs connected together in parallel, a capacitor connected in series to at least one side of the line going to the matrix of opposing parallel LEDs with every set of opposing parallel LEDs having an individual resistor in series to the power connection.

Yet another form of the invention is an LED circuit comprising opposing parallel series strings of LEDs connected together and driven direct with a high frequency AC voltage equal to or less than to total series voltage drop of the opposing parallel series strings of LEDs within the LED circuit.

Another form of the invention comprises a method of driving LED circuits direct from an AC power source ("LED circuit driver") having a relatively fixed voltage and relatively fixed frequency. The LED circuit driver may be a mains power source, the output of a transformer, a generator or an inverter driver that provides a relatively fixed voltage and relatively fixed frequency as the load changes and may be a higher or lower frequency than the frequencies of mains power sources. The LED circuit driver provides a relatively fixed voltage and relatively fixed frequency output even when one or more LED circuits are added to or removed from the output of the LED circuit driver. Higher frequency inverters with lower output voltages are used as one LED circuit driver in order to reduce component size and simplify manufacturing and standardization of LED circuits through the availability of higher frequency LED circuit drivers. The LED circuit driver may also include circuitry that reduces or eliminates surge current offering a soft-start feature by using MOSFET transistors, IGBT transistors or other electronic means. The LED circuit driver may also be pulsed outputs at a higher or lower frequency than the primary frequency.

Another form of the invention is a LED lighting system comprising a LED circuit array having a plurality of different LED circuits each drawing the same or different currents and delivering the same or different lumen outputs that may be the same or different colors and an LED circuit driver coupled to the LED circuit array. The LED circuit driver delivering a relatively fixed t frequency and voltage output allows for mixing and matching of LED circuits requiring different forward voltages and drive currents. The LED circuits may be connected to the output of an LED circuit driver in parallel one LED circuit at a time within the limit of the wattage rating of the LED circuit driver with no need to change or adjust the LED circuit driver as would typically be required with DC drivers and LEDs when increasing or reducing the load with LEDs and other components. Never having to go back to the power source allows for more efficient integration and scalability of lighting systems designed with LED circuits. Introducing an inductor and/or an additional capacitor such as the impedance circuit described in prior art between the LED circuit drive source and the LED circuits would require changes to the driver or components and prohibit scalability, standardization and mass production of AC-LEDs with integrated capacitors or RC networks.

With the LED circuit driver providing a known relatively constant AC voltage and frequency, mass production of various LED circuits with specific capacitor or RC network values would deliver 20 mA, 150 mA or 350 mA or any other desired current to the LED circuit based on the output of the specified LED circuit driver. The relatively fixed voltage and frequency allows for standardization of LED circuits through the standardization of LED circuit drivers.

In another aspect, a transistor is coupled to at least one power connection of the LED circuit or built into the LED circuit package in series between the power connection lead and the LED circuit with the transistor being operable to control (e.g., varying or diverting) the flow of the alternating current through the LED circuit through a capacitance within the transistor.

The foregoing forms as well as other forms, features and advantages of the present invention will become further apparent from the following detailed description of the presently preferred embodiments, read in conjunction with the accompanying drawings. The detailed description and drawings are merely illustrative of the present invention rather than limiting, the scope of the present invention being defined by the appended claims and equivalents thereof.

DETAILED DESCRIPTION OF PREFERRED EMBODIMENTS

Figure 1:
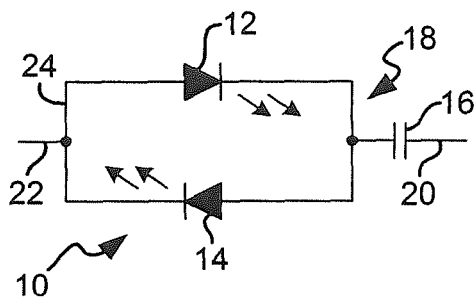
FIG. 1 shows a schematic view of a preferred embodiment of the invention.

FIG. 1 discloses a schematic diagram of a light emitting device 10 for an AC driver according to the invention. The device 10 includes a first LED 12 connected to a second LED 14 in opposing parallel configuration, a capacitor 16 connected in series between a first junction 18 of the two opposing parallel LEDs, a first power connection 20 connected to the two opposing parallel LEDs, and a second power connection 22 connected to a second junction 24 of the two opposing parallel connected LEDs. A diode may be used in place of LED 12 or LED 14.

Figure 2:
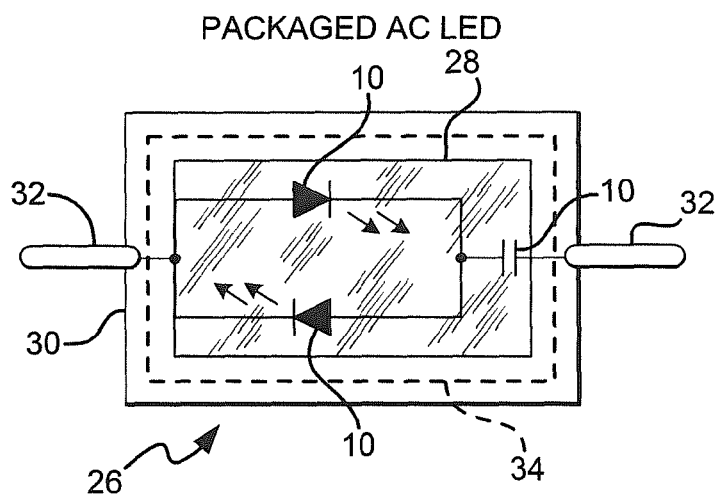
FIG. 2 shows a schematic view of a preferred embodiment of the invention.

FIG. 2 discloses a schematic diagram of a light emitting device 26 for an LED circuit driver according to the invention. The device 26 includes the device 10 as disclosed in FIG. 1 mounted on an insulating substrate 28 such as but not necessarily ceramic or sapphire and integrated into an LED package 30 that may be various LED package sizes; materials and designs based of product specifications or on printed circuit board material. The device 26 provides power connection leads 32 and may have a first or additional lens 34 that may be made of a plastic, polymer or other material used for light dispersion and the lens may be coated or doped with a phosphor or nano-particle that would produce a change in the color or quality of light emitted from the device 10 through the lens 34.

Figure 3:
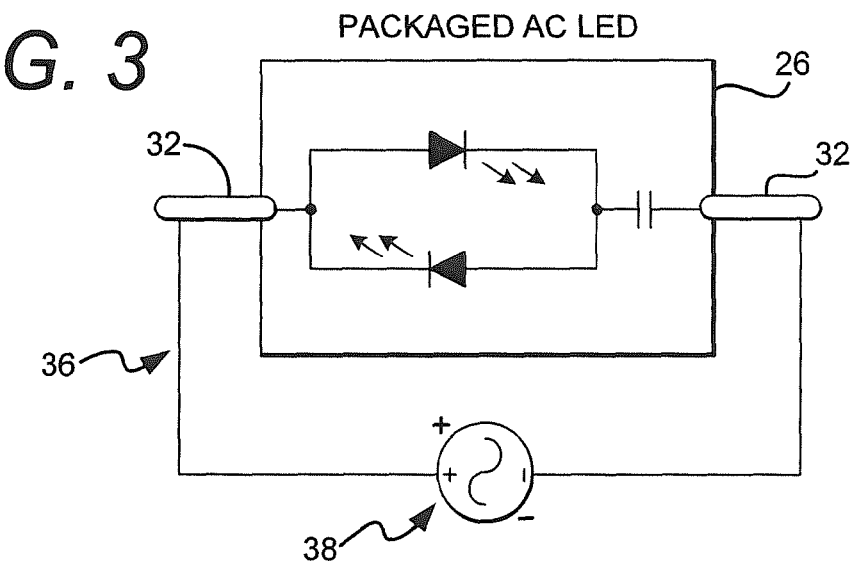
FIG. 3 shows a schematic view of a preferred embodiment of the invention.

FIG. 3 discloses a schematic diagram of a device 36 having a schematic diagram of a light emitting device 26 driven directly by an AC driver 38 that is connected to the power connections 32 of the device 26 without any additional components in series between the AC driver 38 and the device 26 such as a capacitor, inductor or resistor. The AC driver 38 provides a relatively constant AC voltage and frequency output to the device 26 no matter what the total load of the device 26 may be or the number of devices 26 changed as long as the load does not exceed the wattage limitation of the AC driver 38. The AC driver 38 may be a generator, a mains power source, or an inverter capable of providing a relatively fixed voltage and relatively fixed frequency output to different size loads. The AC driver may provide a low or high voltage and a low or high frequency to the device 26 according to the invention as long as the capacitor 16 is the proper value for the desired operation of the device 26.

Figure 4:
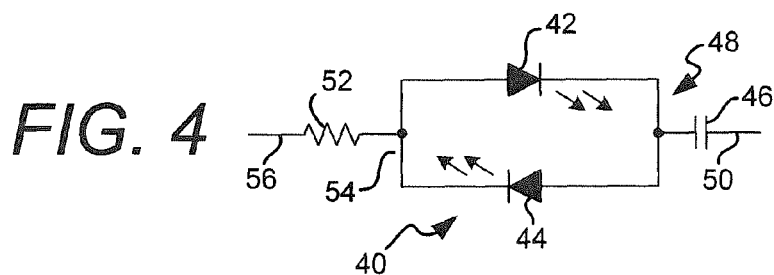
FIG. 4 shows a schematic view of a preferred embodiment of the invention.

FIG. 4 discloses a schematic diagram of a light emitting device 40 for coupling to an LED circuit driver according to the invention. The device 40 includes a first LED 42 connected to a second LED 44 in opposing parallel configuration. A capacitor 46 is connected in series between a first junction 48 of the two opposing parallel LEDs and a first power connection 50. A resistor 52 is connected in series between a second junction 54 of the two opposing parallel LEDs and a second power connection 56. A diode may be used in place of LED 42 or LED 44 and the resistor 52 may be put in series on either end of the capacitor 46 as an alternate location.

Figure 5:
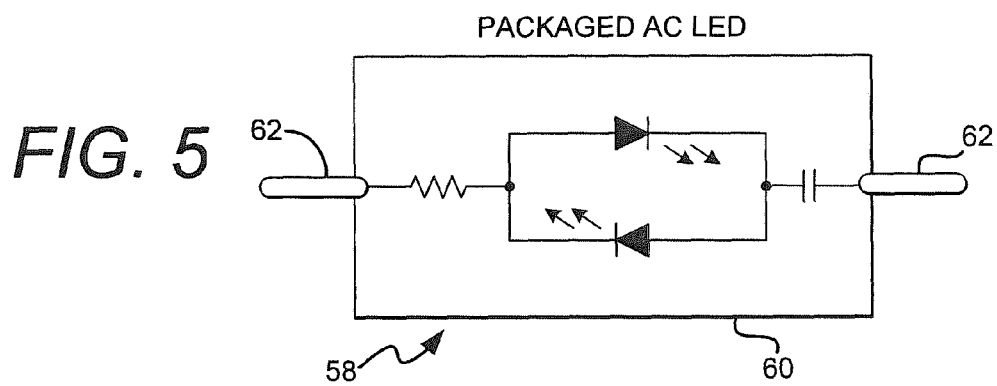
FIG. 5 shows a schematic view of a preferred embodiment of the invention.

FIG. 5 discloses a schematic diagram of a light emitting device 58 for LED circuit drivers according to the invention. The device 58 includes the device 40 as disclosed in FIG. 4 integrated into a package as disclosed in the device 26 in FIG. 2. The device 58 provides power connection leads for connecting to an AC driver 38 as disclosed in FIG. 3.

Figure 6:
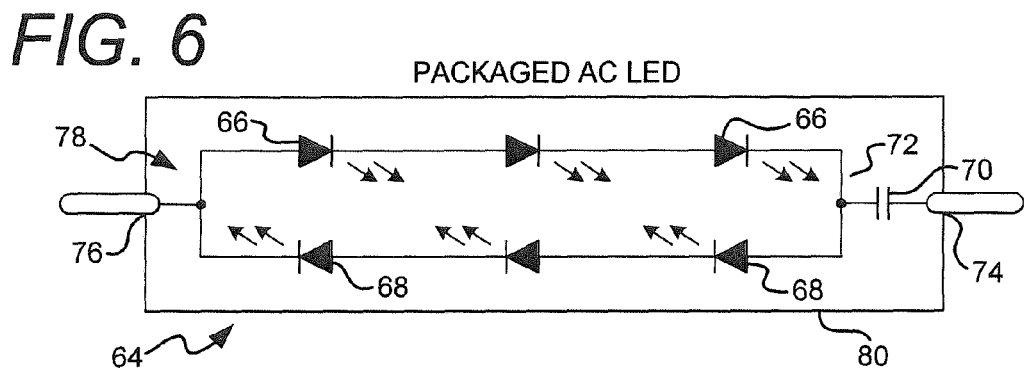
FIG. 6 shows a schematic view of a preferred embodiment of the invention.

FIG. 6 discloses a diagram of a light emitting device 64 for coupling to an LED circuit driver according to the invention. The device 64 includes a first series string of LEDs 66 connected to a second series string of LEDs 68 in opposing parallel configuration, a capacitor 70 connected in series between a first junction 72 of the opposing parallel series string of LEDs and a first power connection 74, and a second power connection 76 connected to a second junction 78 of the opposing parallel series string of LEDs. A diode may be used in place of one or more LEDs 66 and one or more of LEDs 68 and the LEDs 66 and 68 are integrated into a package 80 as described in the package 30 disclosed in FIG. 2. along with capacitor 70.

Figure 7:
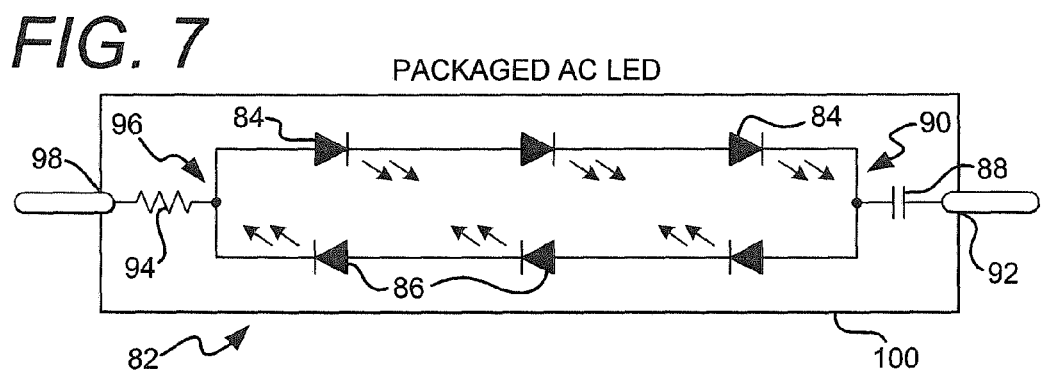
FIG. 7 shows a schematic view of a preferred embodiment of the invention.

FIG. 7 discloses a diagram of a light emitting device 82 for AC drive according to the invention. The device 82 includes a first series string of LEDs 84 connected to a second series string of LEDs 86 in opposing parallel configuration, a capacitor 88 connected in series between a first junction 90 of the opposing parallel series string of LEDs and a first power connection 92, and a resistor 94 connected in series between a second junction 96 of the opposing parallel series string of LEDs and a second power connection 98. A diode may be used in place of one or more LEDs 84 and one or more of LEDs 86 and the LEDs 84 and 86 are integrated into a package 100 as described in the package 30 disclosed in FIG. 2 along with capacitor 88 and resistor 94. The resistor 94 may be put in series on either end of the capacitor 88 as an alternate location.

Figure 8:
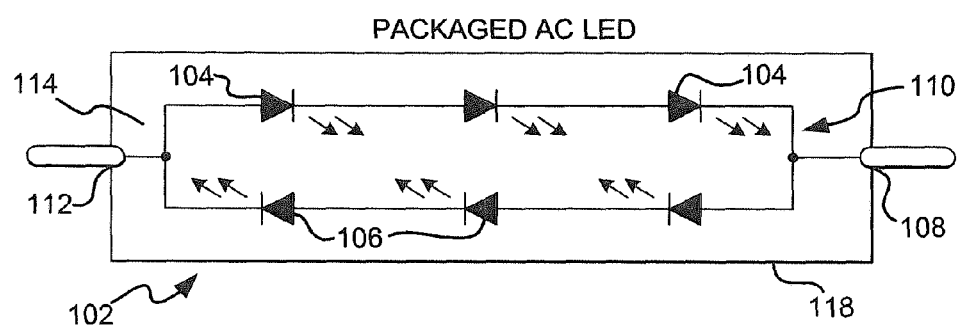
FIG. 8 shows a schematic view of a preferred embodiment of the invention.

FIG. 8 discloses a diagram of a light emitting device 102 according to the invention. The device 102 includes a first series string of LEDs 104 connected to a second series string of LEDs 106 in opposing parallel configuration. A first power connection 108 is connected to a first junction 110 of the opposing parallel series string of LEDs and a second power connection 112 is connected to a second junction 114 of the opposing parallel series string of LEDs. A diode may be used in place of one or more LEDs 104 and one or more of LEDs 106 and the LEDs 104 and 106 are integrated into a package 118 as described in the package 30 disclosed in FIG. 2.

Figure 9:
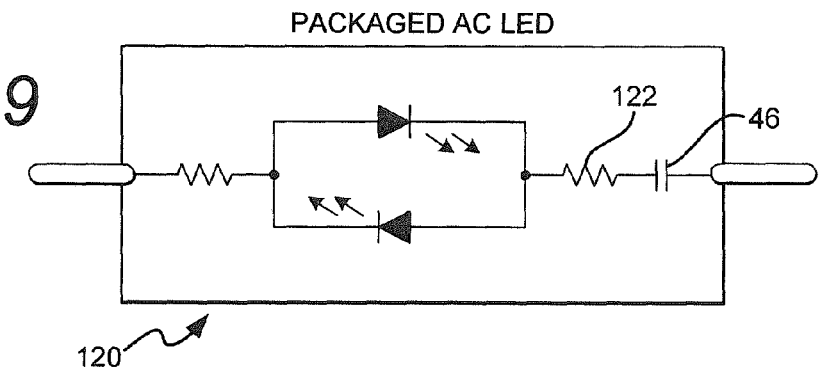
FIG. 9 shows a schematic view of a preferred embodiment of the invention.

FIG. 9 discloses a circuit diagram of a light emitting device 120 according to the invention. The device 120 is similar to the device disclosed in FIG. 5 and includes a second series resistor 122 that can be placed in series on either side of the first capacitor 46.

Figure 10:
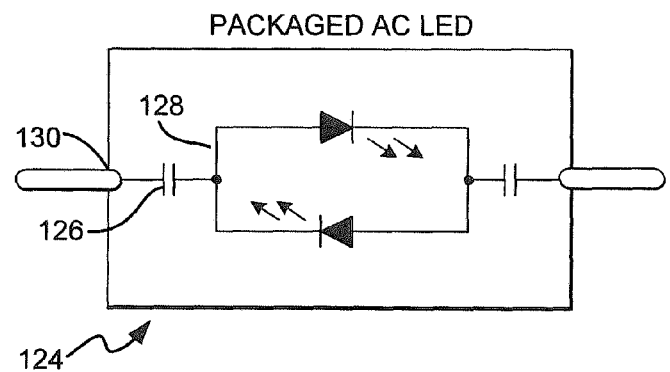
FIG. 10 shows a schematic view of a preferred embodiment of the invention.

FIG. 10 discloses a diagram of a light emitting device 124 according to the invention. The device 124 is similar to the device disclosed in FIG. 2 and includes a second series capacitor 126 connected in series between the junction 128 of the opposing parallel LEDs and a power connection 130.

Figure 11:
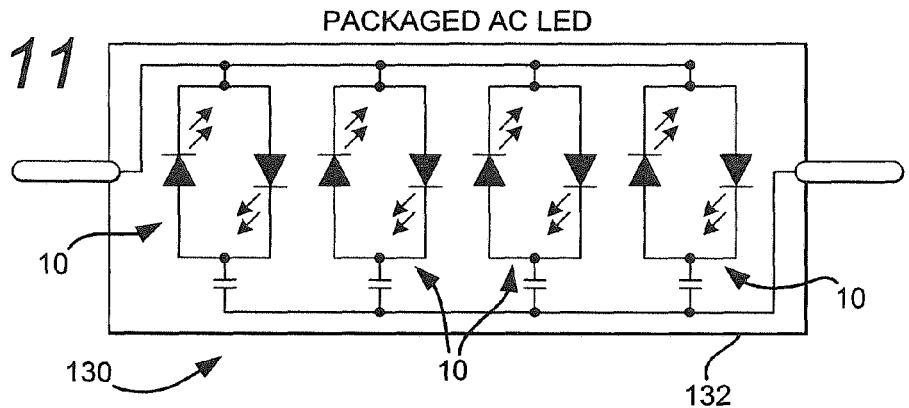
FIG. 11 shows a schematic view of a preferred embodiment of the invention.

FIG. 11 discloses a diagram of a light emitting device 130 according to the invention. The device 130 has a matrix of individual light emitting devices 10 as described in FIG. 1 integrated into a package 132 similar to package 30 as described in FIG. 2.

Figure 12:
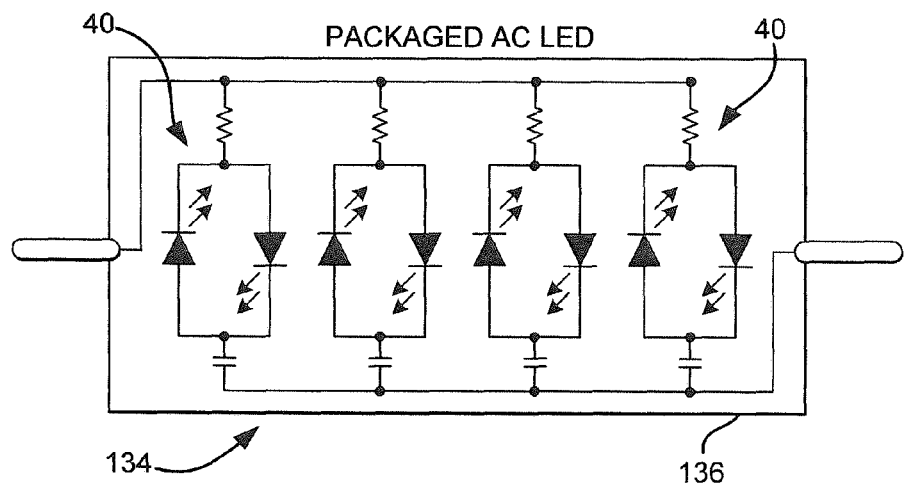
FIG. 12 shows a schematic view of a preferred embodiment of the invention.

FIG. 12 discloses a diagram of a light emitting device 134 according to the invention. The device 134 has a matrix of individual light emitting devices 40 as described in FIG. 4 integrated into a package 136 similar to package 30 as described in FIG. 2.

Figure 13:
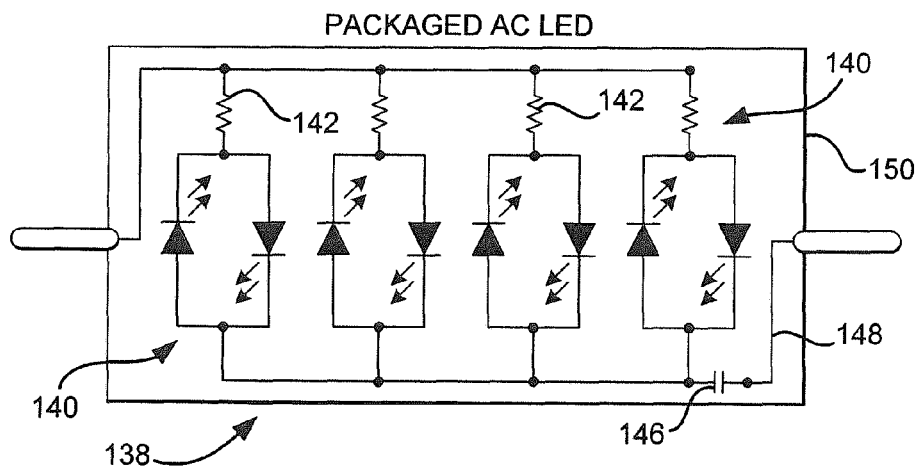
FIG. 13 shows a schematic view of a preferred embodiment of the invention.

FIG. 13 discloses a diagram of a light emitting device 138 according to the invention. The device 138 has a matrix of individual sets of 2 opposing parallel light emitting devices 140 with each set having an individual series resistor to connect to a first power connection 140 and a capacitor 146 connected in series between a second power connection and the matrix of devices 140. The capacitor 146 may alternately be in series between the first power connection 144 and all resistors 142. The matrix of devices 140, resistors 142 and capacitor 146 are integrated into a package 150 similar to package 30 as described in FIG. 2.

Figure 14:
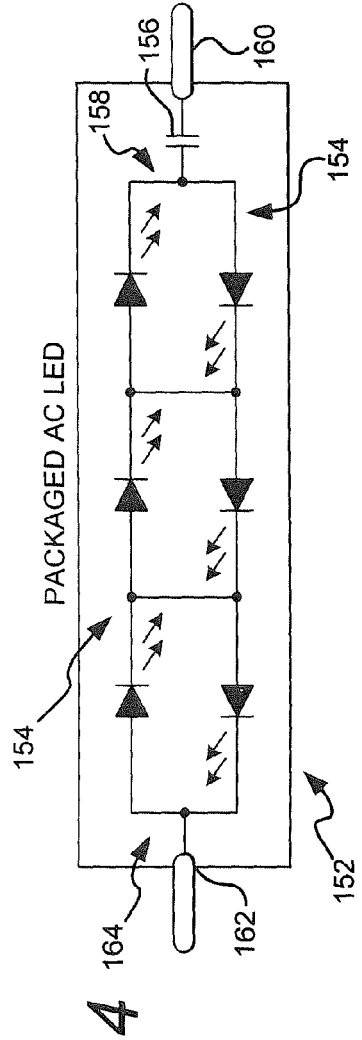
FIG. 14 shows a schematic view of a preferred embodiment of the invention.

FIG. 14 discloses a diagram of a light emitting device 152 according to the invention. The device 152 includes another version of a series opposing parallel LED matrix 154 and a capacitor 156 connected in series between a first junction 158 of the opposing parallel LED matrix 154 and a first power connection, and a second power connection 162 connected to a second junction 164 of the opposing parallel LED matrix. A first power connection 108 is connected to a first junction 110 of the opposing parallel series string of LEDs and a second power connection 112 is connected to a second junction 114 of the opposing parallel series string of LEDs. A diode may be used in place of one or more LEDs 104 and one or more of LEDs 106 and the LEDs 104 and 106 are integrated into a package 118 as described in the package 30 disclosed in FIG. 2.

Figure 15:
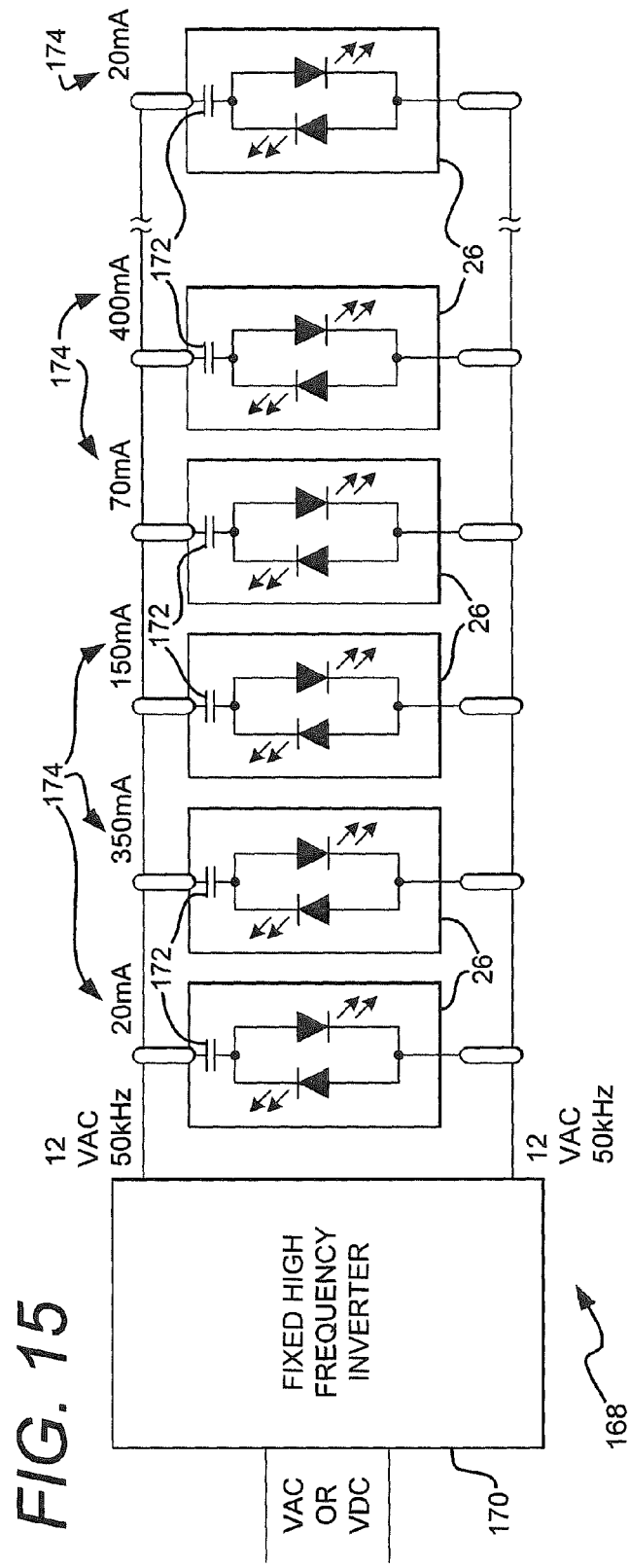
FIG. 15 shows a schematic view of a preferred embodiment of the invention.

FIG. 15 discloses a schematic diagram of a lighting system 168 according to the invention. The device 168 includes a plurality of devices 26 as described in FIG. 2 connected to a high frequency inverter AC drive Method 170 as described in FIG. 3 which in this example provides a relatively constant 12V AC source at a relatively constant frequency of 50 Khz to the devices 26. Each or some of the devices 26 may have integrated capacitors 172 of equal or different values enabling the devices 26 to operate at different drive currents 174 from a single source AC drive Method.

Figure 16:
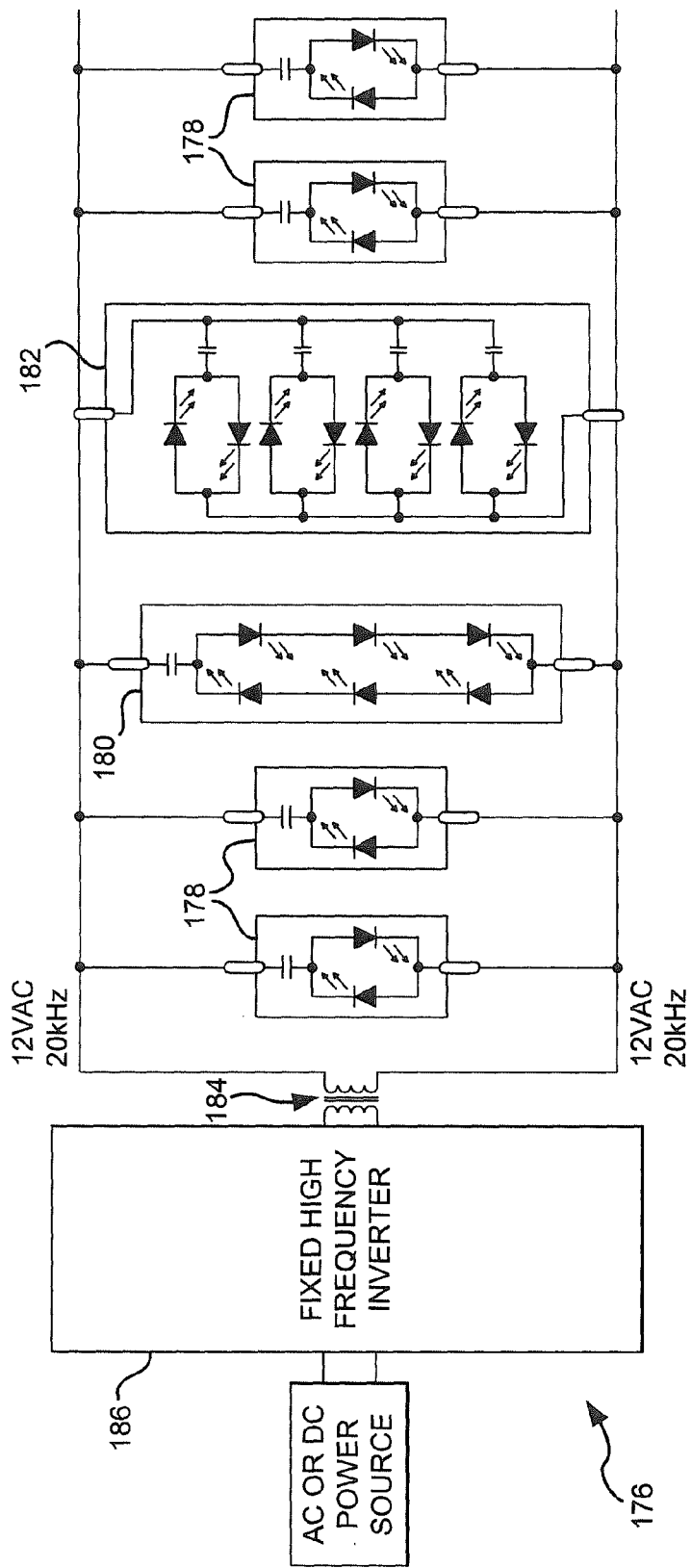
FIG. 16 shows a schematic view of a preferred embodiment of the invention.

FIG. 16 discloses a schematic diagram of a lighting system 176 according to the invention. The lighting system 176 includes a plurality of devices 178, 180 and 182 each able to have operate at different currents and lumens output while connected directly to the transformer 184 output of a fixed high frequency AC drive Method 186.

Figure 17:
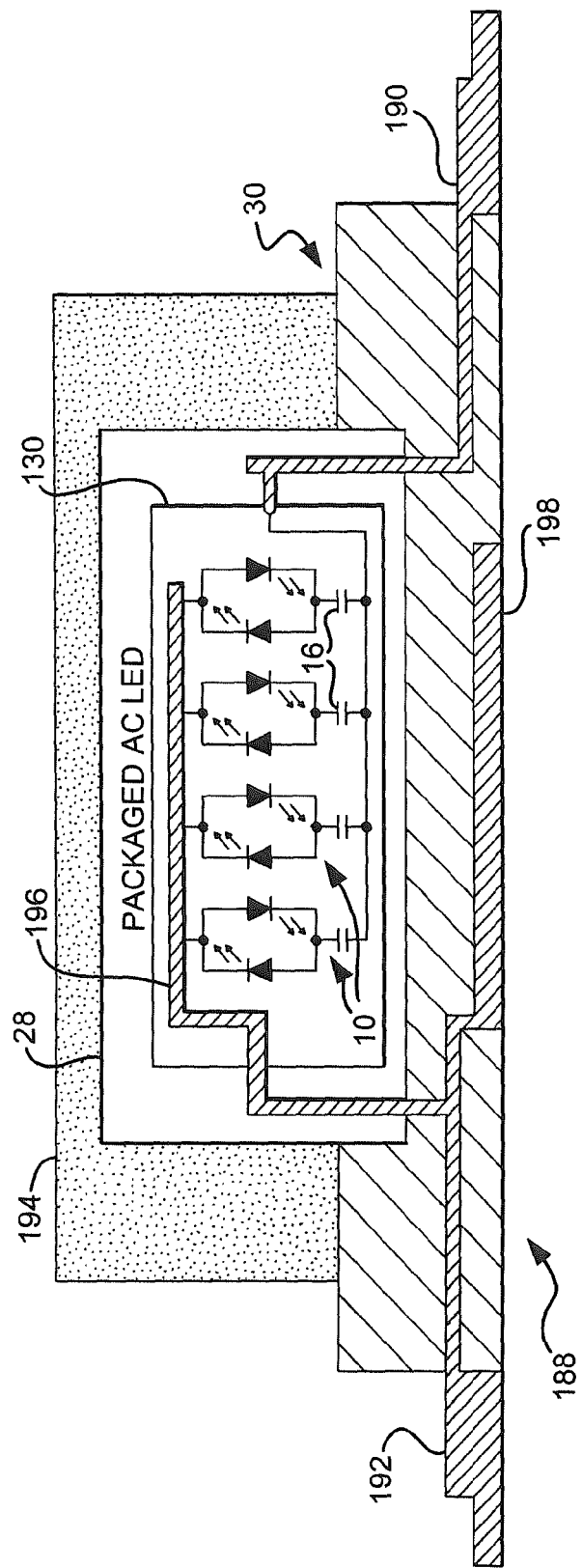
FIG. 17 shows a schematic view of a preferred embodiment of the invention.

FIG. 17 discloses another schematic view diagram of a light emitting device 188 identical to the device 130 disclosed in FIG. 11 and integrated into a package 30 as described in FIG. 2 for an AC drive Method according to the invention. The device 188 includes the device 130 as disclosed in FIG. 11 mounted on an insulating substrate 28 such as but not necessarily ceramic or sapphire and integrated into an LED package 30 that may be various LED package sizes; materials and designs based of product specifications or on printed circuit board material. The device 188 provides power connection leads 190 and 192 and may have a first or additional lens 194 that may be made of a plastic, polymer or other material used for light dispersion and the lens may be coated or doped with a phosphor or nano-crystals that would produce a change in the color or quality of light emitted from the device 130 through the lens 194. The device 130 has a matrix of devices 10. The power connection opposite the capacitors 16 within the device 130 and part of each device 10 is connected to a power connection 196 that is connected to a solderable heat sinking material 198 and integrated into the package 30. The power connection 196 connected to the heat sink 198 may be of a heavier gauge within the device 130 or 188 than other conductors. The schematic view of the device 188 provides a side view of the package 30 and an overhead view of the device 130 in this FIG. 17.

Figure 18:
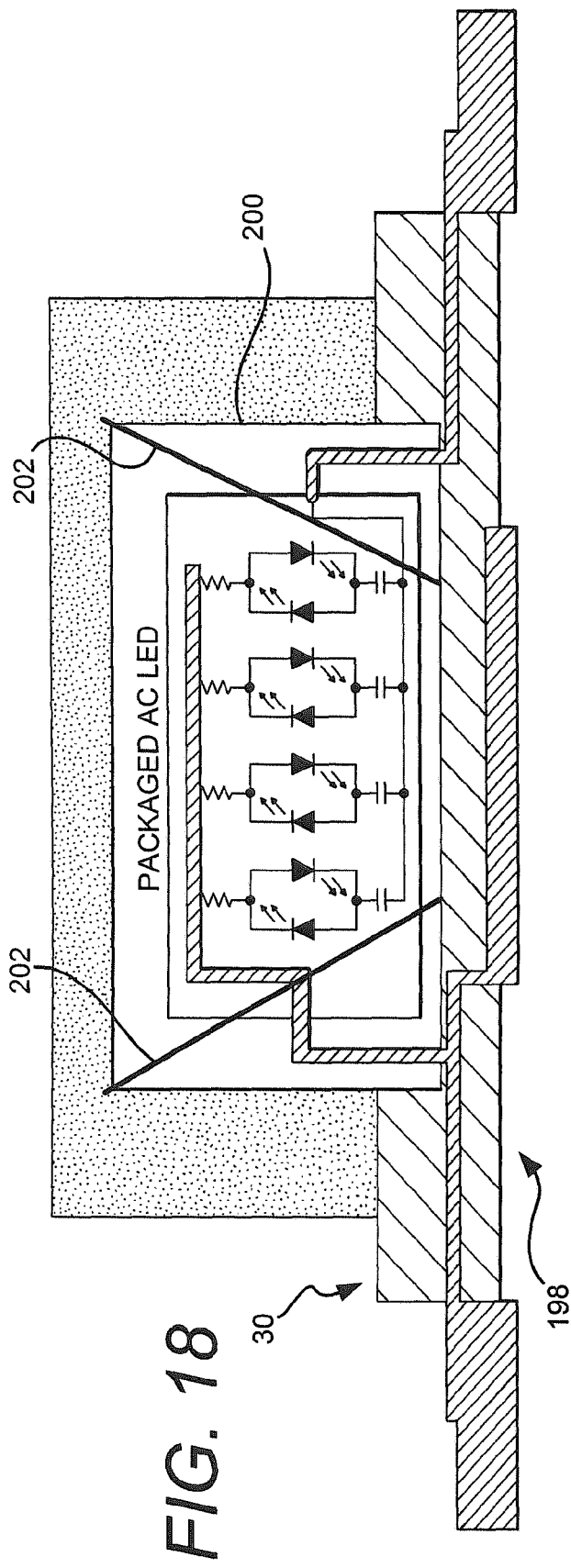
FIG. 18 shows a schematic view of a preferred embodiment of the invention.

FIG. 18 discloses another schematic view diagram of a light emitting device 198 similar to the device 188 described in FIG. 17 with a different light emitting device 200 identical to the device 136 disclosed in FIG. 12 and integrated into a package 30 as described in FIG. 2 for an AC drive Method according to the invention. The device 198 includes a reflective device integrated into the package 30 for optimized light dispersion. The light emitting device 200 may be facing down towards the reflector 202 and opposite direction of light output from the lens 194 if the reflector 202 is integrated into the package 30 properly for such a design.

Figure 19:
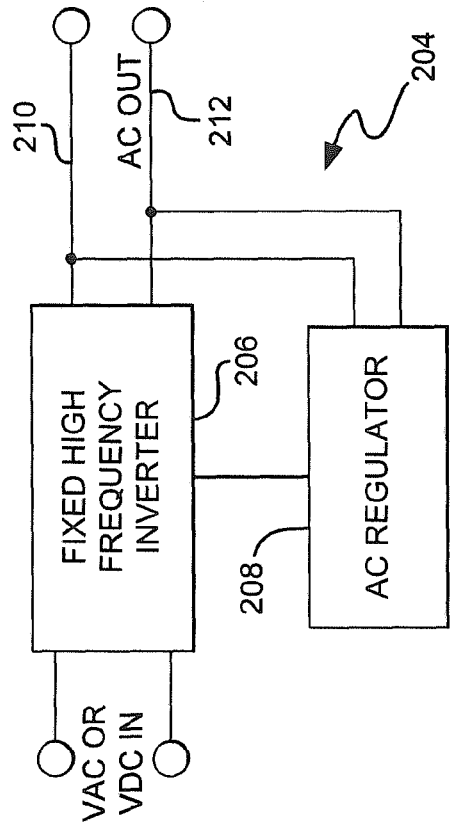
FIG. 19 shows a schematic view of a preferred embodiment of the invention.
Figure 20A:
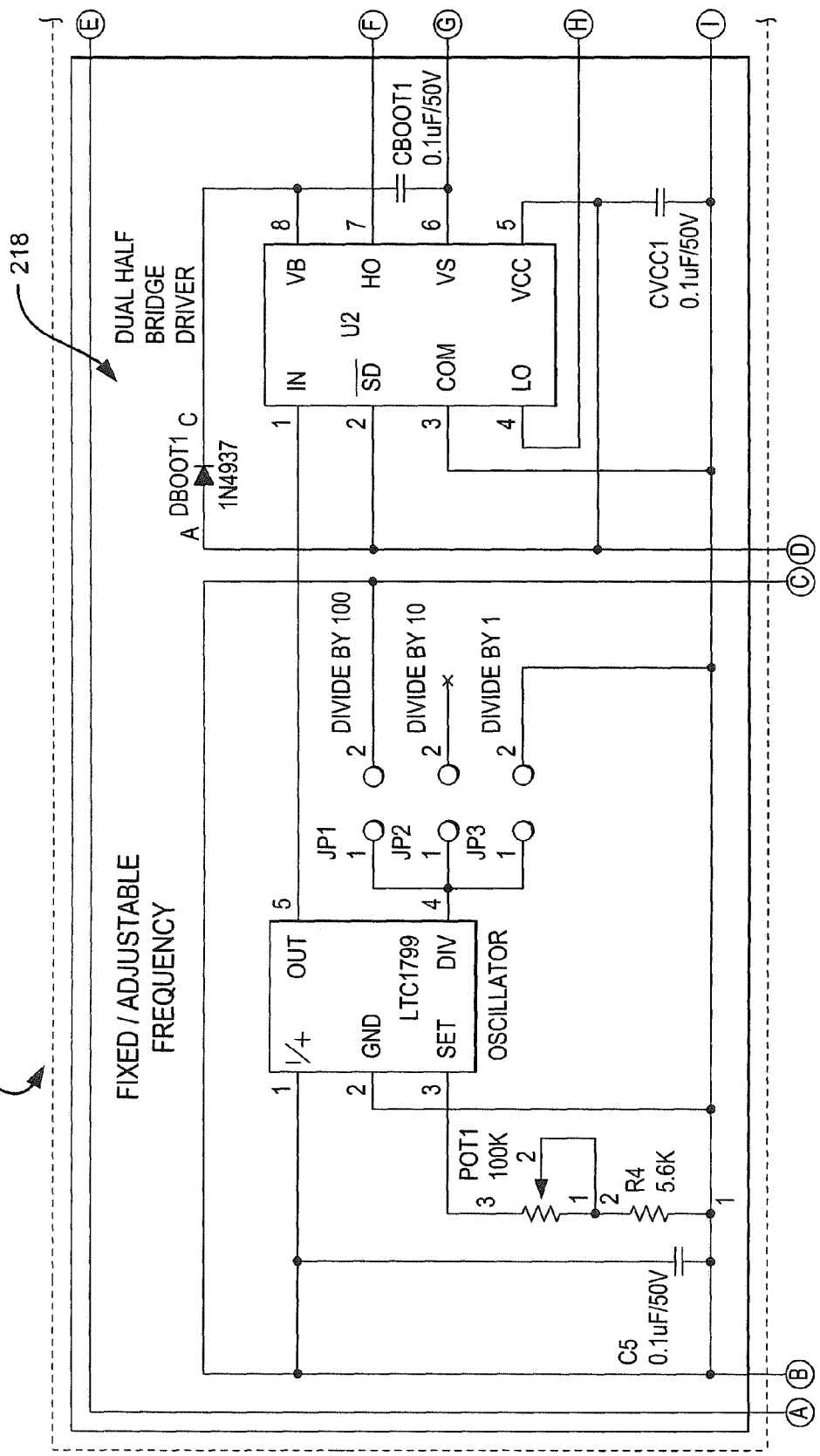
FIG. 20A shows a schematic view of a preferred embodiment of the invention.
Figure 20B:
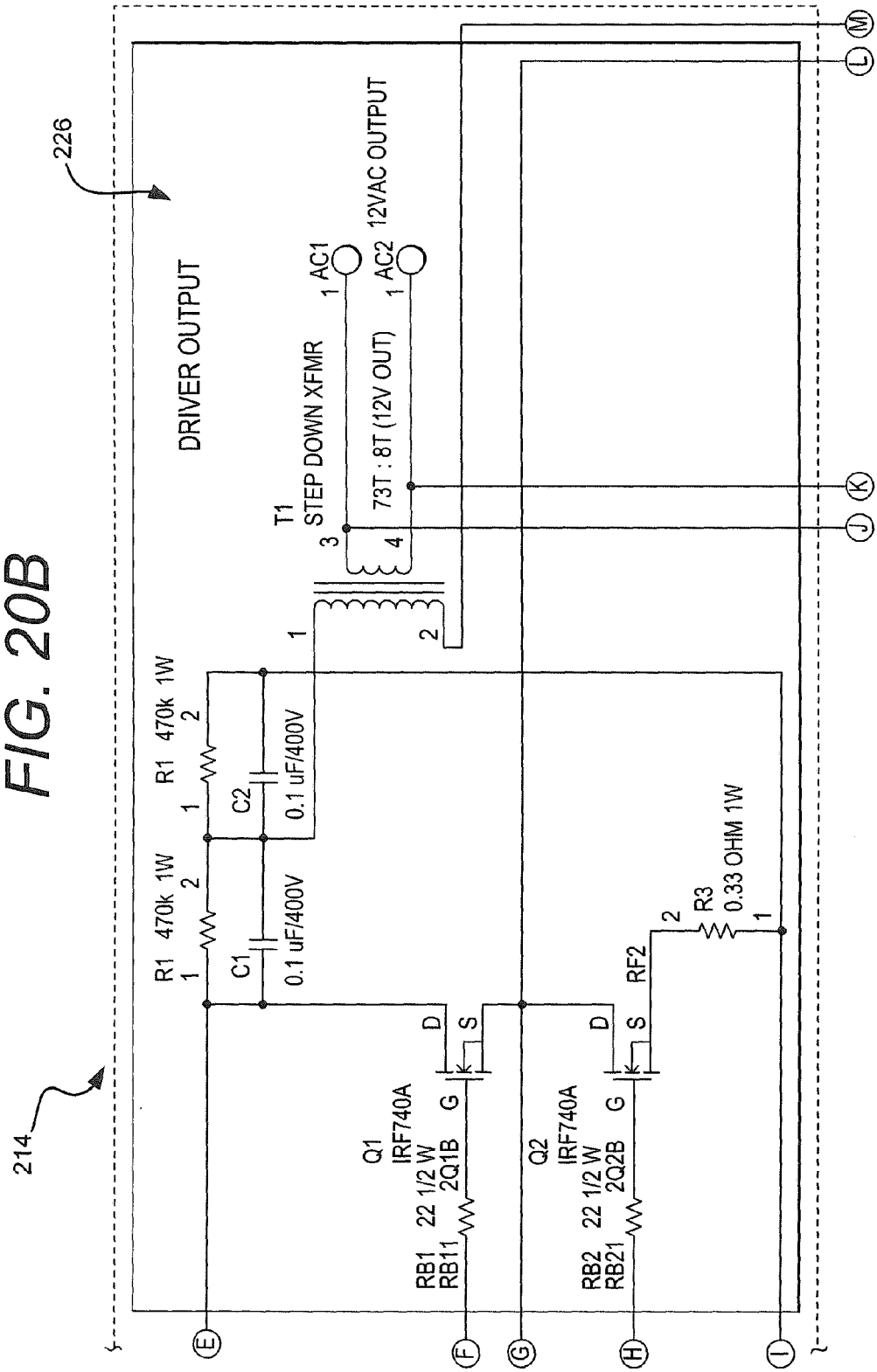
FIG. 20B shows a schematic view of a preferred embodiment of the invention.
Figure 20C:
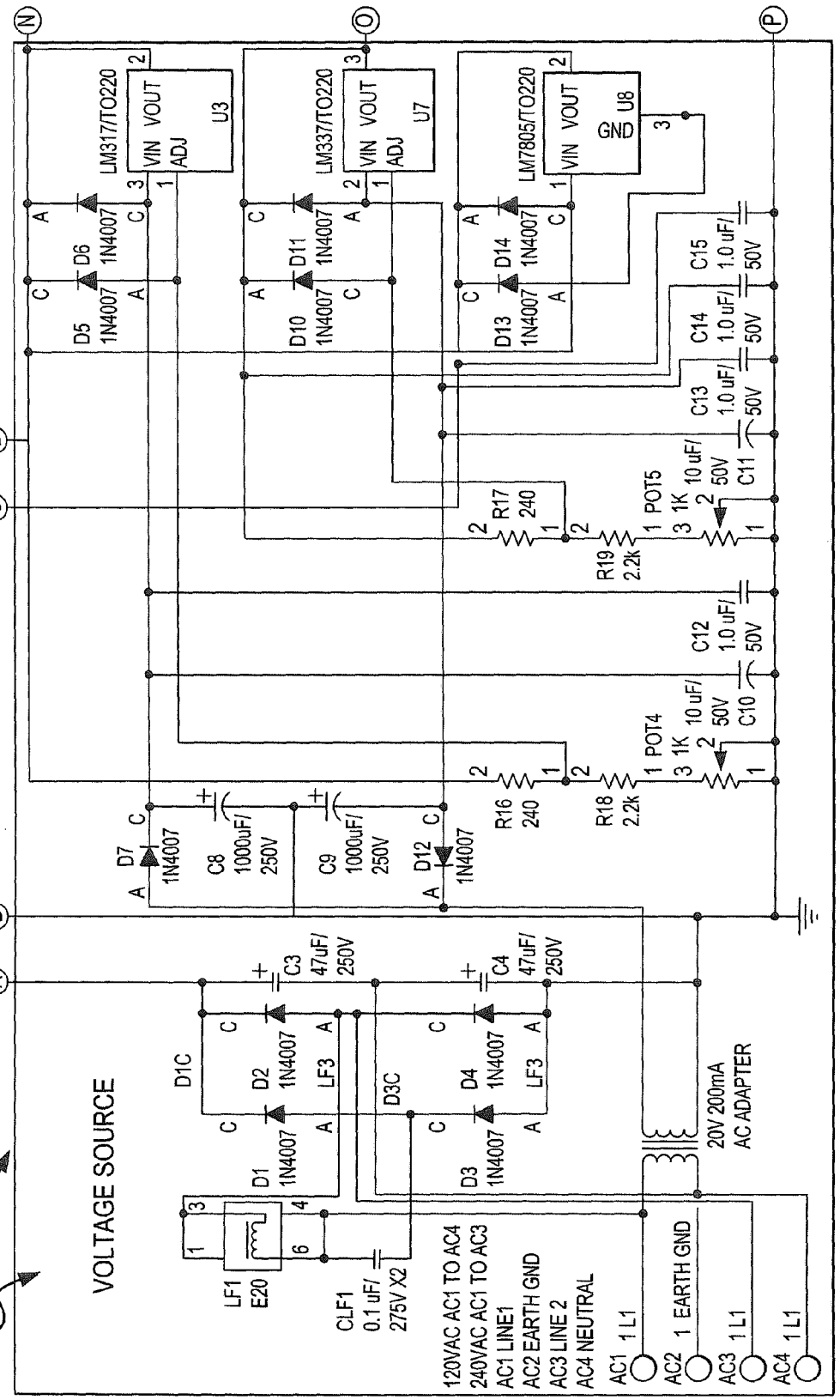
FIG. 20C shows a schematic view of a preferred embodiment of the invention.
Figure 20D:
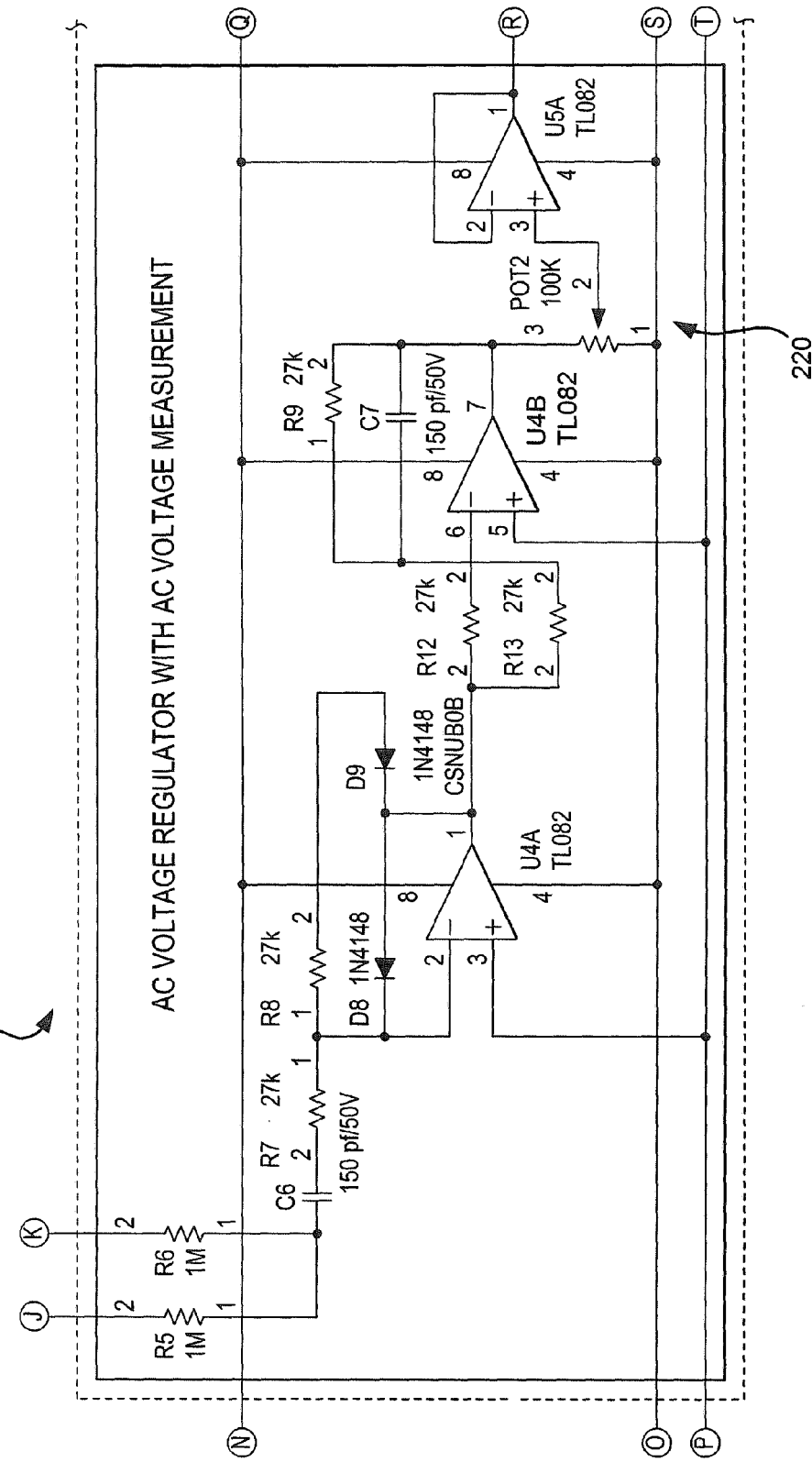
FIG. 20D shows a schematic view of a preferred embodiment of the invention.
Figure 20E:
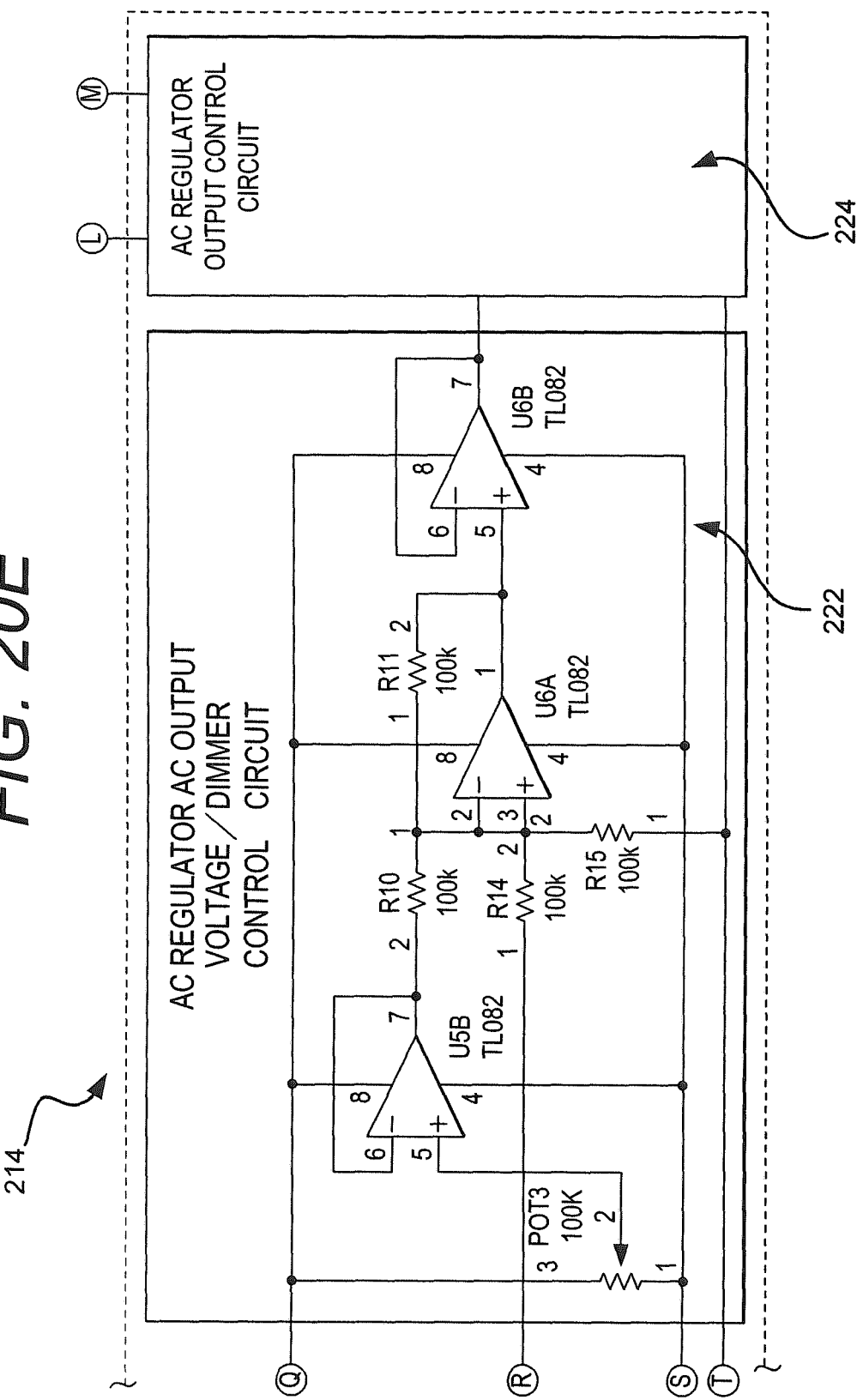
FIG. 20E shows a schematic view of a preferred embodiment of the invention.

FIG. 19 shows a block diagram of an LED circuit driver 204 having a high frequency inverter 206 stage that provides a relatively constant voltage and relatively constant frequency output. The high frequency inverter 206 stage has an internal dual half bridge driver with an internal or external voltage controlled oscillator that can be set to a voltage that fixes the frequency. A resistor or center tapped series resistor diode network within the high frequency inverter 206 stage feeds back a voltage signal to the set terminal input of the oscillator. An AC regulator 208 senses changes to the load at the output lines 210 and 212 of the inverter 206 and feeds back a voltage signal to the inverter 208 in response changes in the load which makes adjustments accordingly to maintain a relatively constant voltage output with the relatively constant frequency output.

FIG. 20 shows a schematic diagram of an LED circuit driver 214 having a voltage source stage 216, a fixed/adjustable frequency stage 218, an AC voltage regulator and measurement stage 220, an AC level response control stage 222, an AC regulator output control stage 224 and a driver output stage 226.

Figure 21:
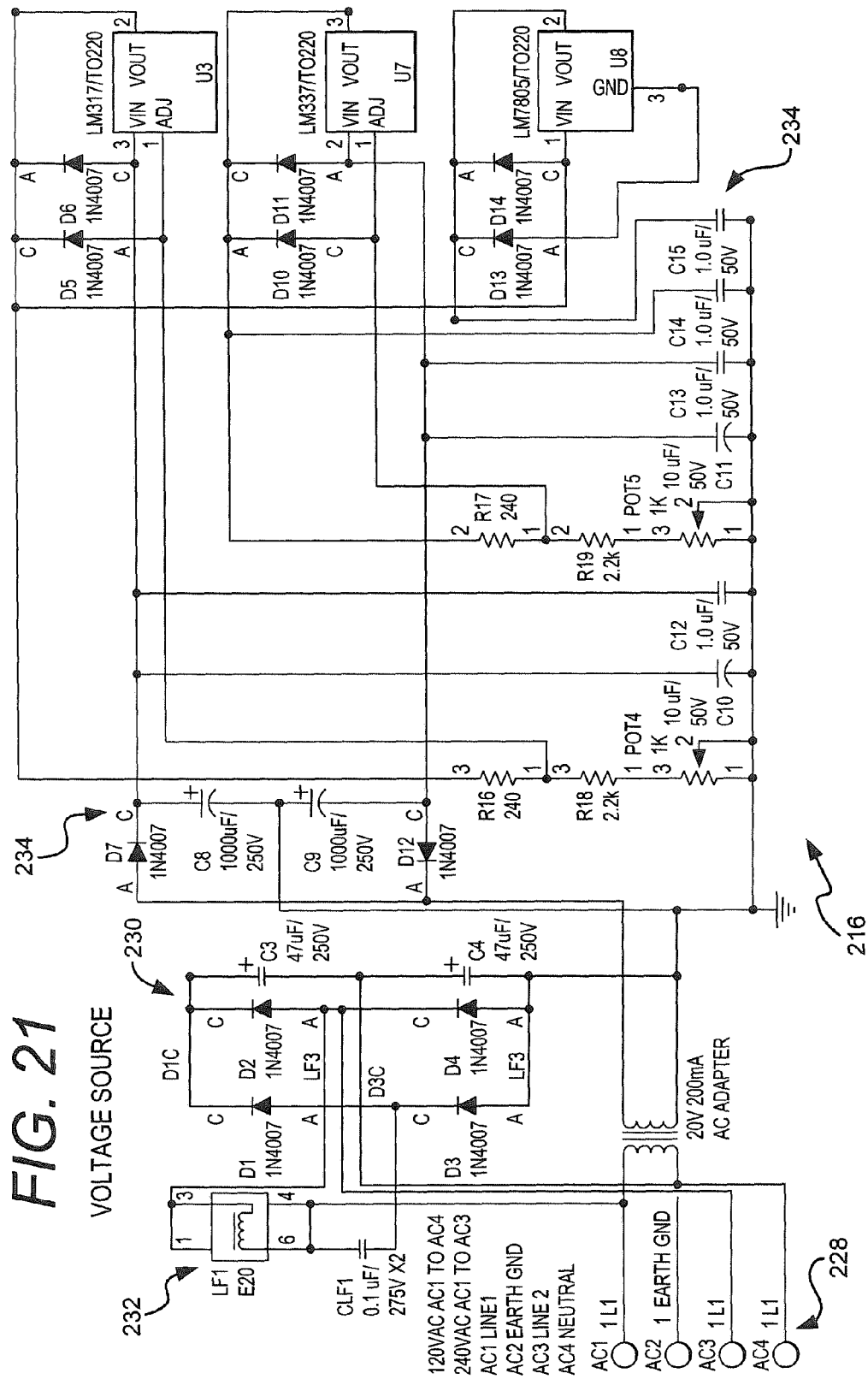
FIG. 21 shows a schematic view of a preferred embodiment of the invention.

FIG. 21 shows a schematic diagram of the voltage source stage 216 described in FIG. 20. The voltage source stage 216 provides universal AC mains inputs 228 that drive a diode bridge 230 used to deliver DC to the LED circuit driver system 214. Direct DC could eliminate the need for the universal AC input 228. Power factor correction means 232 may be integrated into the LED circuit driver 216 as part of the circuit. The voltage source stage 216 includes a low voltage source circuit 234 that may include more than one voltage and polarity.

Figure 22:
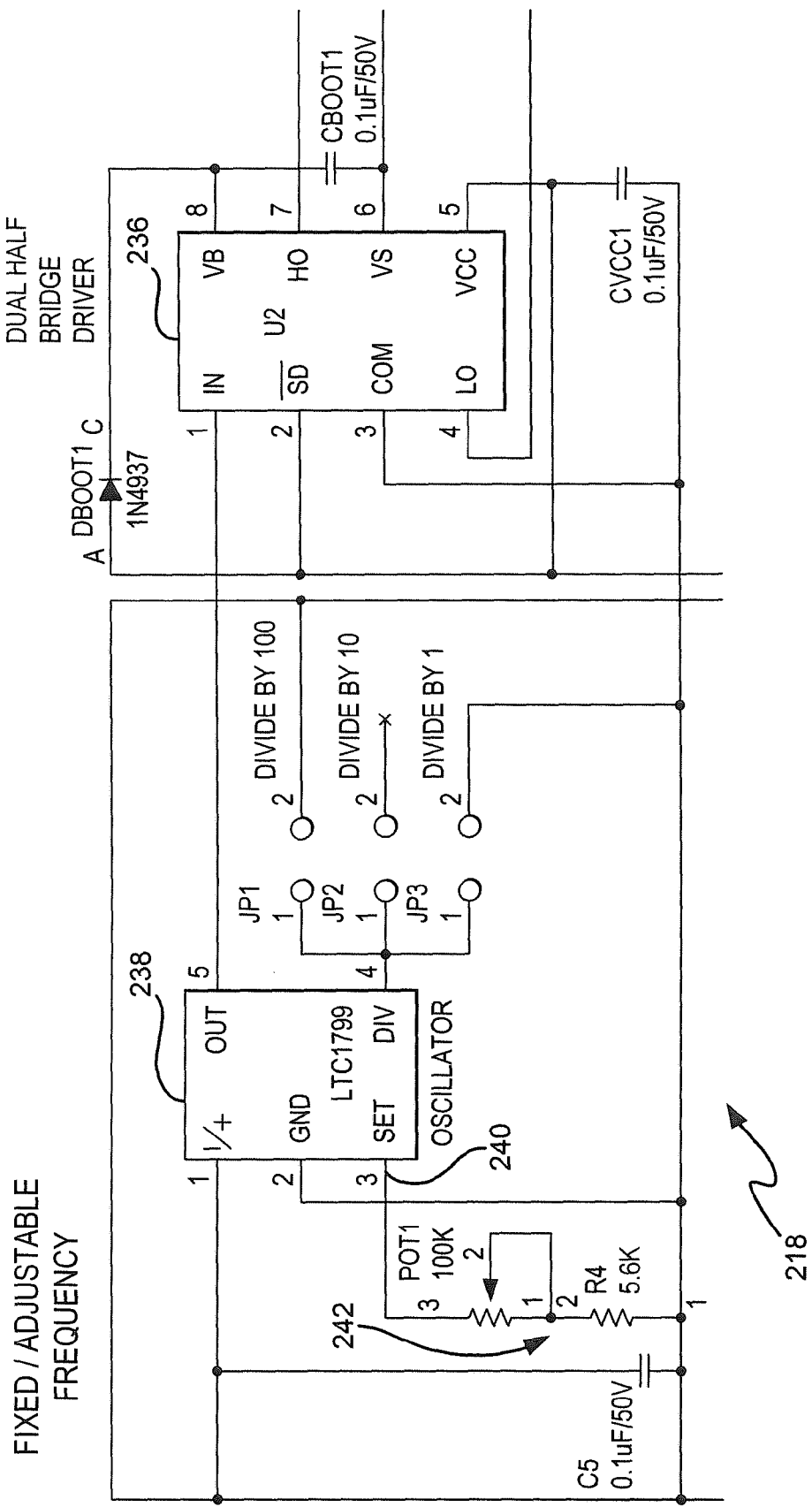
FIG. 22 shows a schematic view of a preferred embodiment of the invention.

FIG. 22 shows a schematic diagram of the fixed/adjustable frequency stage 218 as described in FIG. 20. The fixed/adjustable frequency stage 218 includes a bridge driver 236 that may include an integrated or external voltage controlled oscillator 238. The oscillator 238 has a set input pin 240 that sets the frequency of the oscillator to a fixed frequency through the use of a resistor or adjustable resistor 242 to ground. The adjustable resistor 242 allows for adjusting the fixed frequency to a different desired value through manual or digital control but keeps the frequency relatively constant based on the voltage at the set terminal 240.

Figure 23:
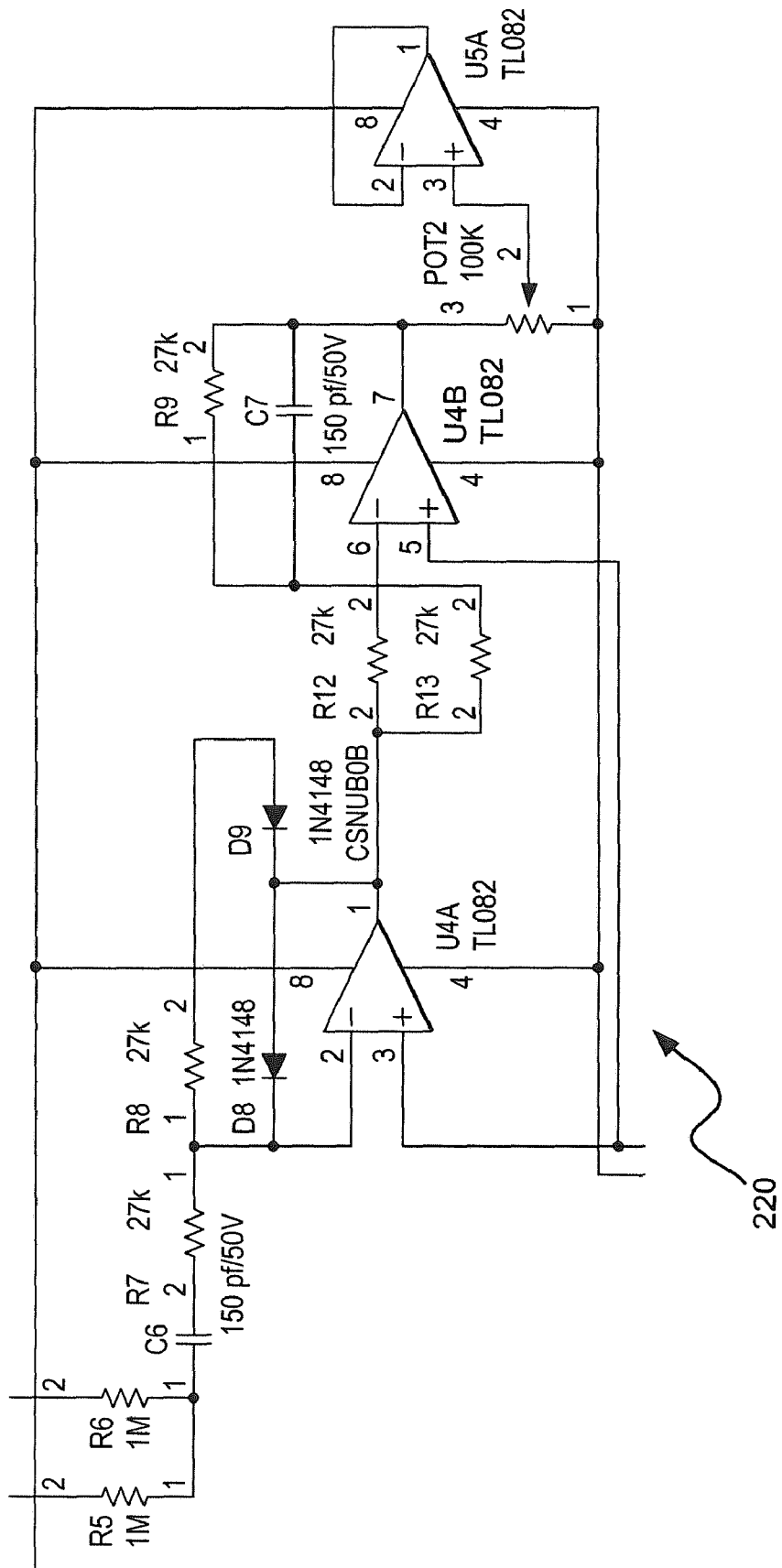
FIG. 23 shows a schematic view of a preferred embodiment of the invention.

FIG. 23 is a schematic diagram of the AC voltage regulator with voltage measurement stage 220 as described in FIG. 20. The AC voltage regulator with voltage measurement circuit 220 monitors the voltage at the driver output 226 as shown in FIG. 20 and sends a voltage level signal to the AC level response control stage 222 as shown in FIG. 20.

Figure 24:
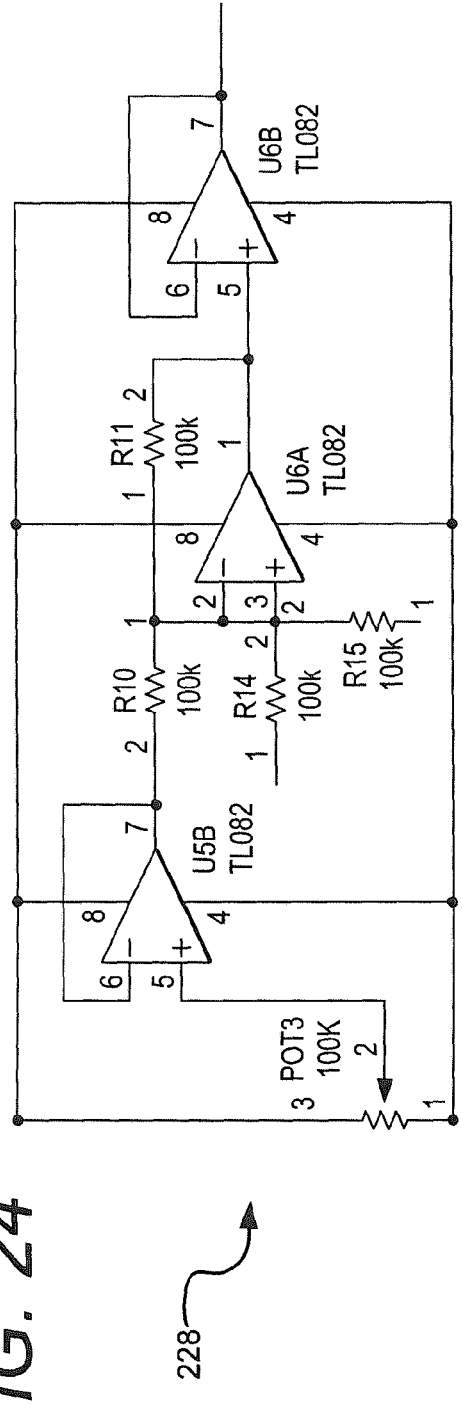
FIG. 24 shows a schematic view of a preferred embodiment of the invention.

FIG. 24 is a schematic diagram of the AC level response control 228 stage. The AC level response control stage 228 receives a voltage level signal from the AC voltage regulator with voltage measurement circuit 220 as shown in FIG. 23 and drives the AC regulator output control stage 224 as shown in FIG. 20.

Figure 25:
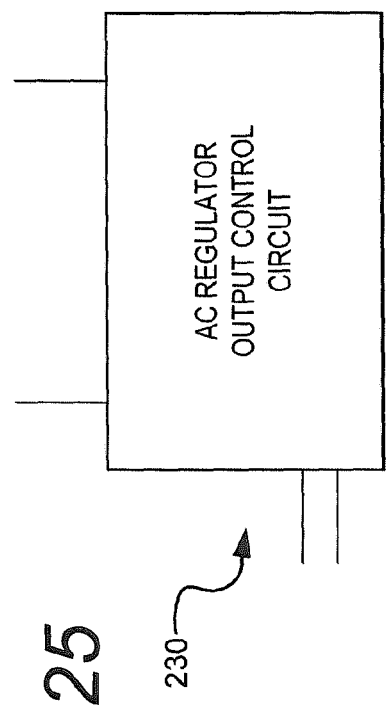
FIG. 25 shows a schematic view of a preferred embodiment of the invention.
Figure 26:
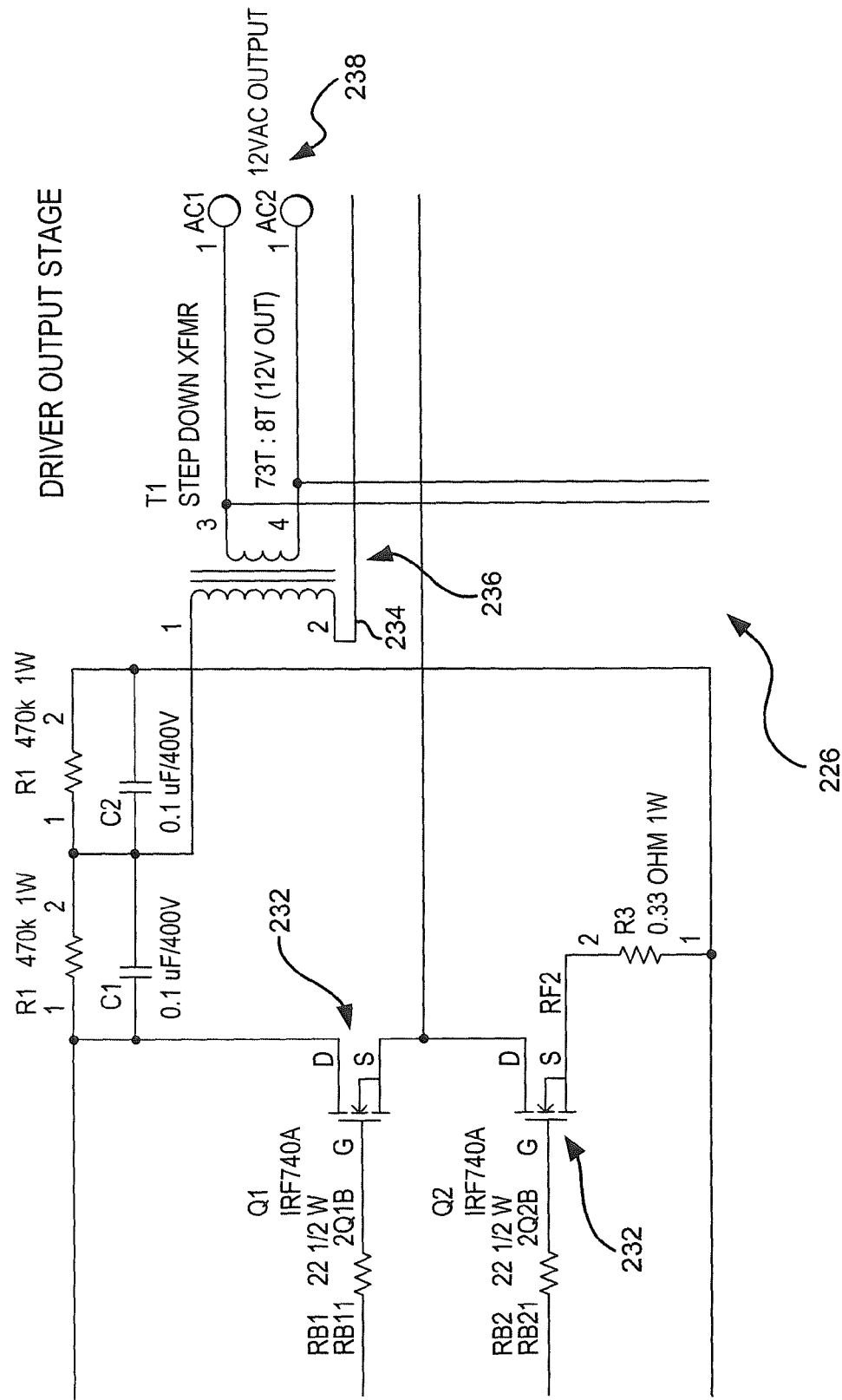
FIG. 26 shows a schematic view of a preferred embodiment of the invention.

FIG. 25 is a schematic diagram of the AC regulator output control stage 230. The AC regulator output control stage 230 varies the resistance between the junction of the drive transistors 232 and the transformer input pin 234 of the driver output 226 as shown in FIG. 26. The AC regulator output control stage 230 is a circuit or component such as but not necessarily a transistor, a voltage dependent resistor or a current dependent resistor circuit having a means of varying its resistance in response to the voltage or current delivered to it.

FIG. 26 is a schematic diagram of the driver output stage 226. The driver output stage 226 includes drive transistors 232 and the transformer 236 that delivers an AC voltage output 238 to LED circuits at a relatively constant voltage and frequency.

What is claimed is:

1. A lighting system comprising:
   two or more LED circuits each LED circuit having at least two diodes connected to each other in opposing parallel relation, at least one of which such diodes is an LED;
   a driver connected to the two or more LED circuits, the driver providing AC voltage and current to the two or more LED circuits, the driver having an input of a first AC voltage and a first frequency and an output of a second AC voltage and a second frequency, which the second AC voltage is a relatively fixed voltage and the second frequency is a relatively higher frequency
   wherein the driver and the two or more LED circuits forming a driven circuit and the driver and the two or more LED circuits being configured such that one or more LED circuits can be added to or subtracted from the driven circuit so long as the total wattage output of the driver is not exceeded:
   (a) without significantly affecting a pre-determined desired output range of light from any individual LED;
   (b) without the need to: (i) change a value of any discrete component; or, (ii) to add or subtract any discrete components, of any of the pre-existing driven circuit components which remain after the change.

2. The lighting system of claim 1 further comprising at least one resistor being connected to and being part of each opposing parallel LED circuit, the resistor being connected in series with at least one capacitor.

3. The lighting system of claim 1 wherein the AC driver is the mains power and the LED circuits are packaged with connectors which accommodate a standard utility outlet.

4. The lighting system of claim 1 wherein the AC driver provides high frequency AC voltage.

5. The lighting system of claim 4 wherein the frequency provided by the driver is above 100 cycles per second.

6. The lighting system of claim 1 wherein at least one of the two or more LED circuits has opposing parallel series strings of LEDs.

7. The lighting system of claim 1 wherein the two or more LED circuits are packaged separately from the driver.

8. The lighting system of claim 7 wherein the packaged LED circuits include one or more lenses.

9. The lighting system of claim 1 wherein at least one capacitor is the discrete components.

10. The lighting system of claim 1 wherein a capacitance is provided as an inherent attribute of a circuit component which serves to provide a function in addition to or besides providing capacitance.

11. The lighting system of claim 1 including a phosphor coating over the LEDs.

12. The lighting system of claim 1 including lenses for the LEDS and nano-crystals doped in the lenses to affect the light output of the LEDs.

13. The lighting system of claim 7 wherein the package includes one or more of an integrated heat sinking material, a reflective material integrated within the package near the LEDs reflecting the light out from the package, and lenses for the LEDs.

14. The lighting system of claim 1 wherein the LEDs are organic LEDs.

15. The lighting system of claim 5 wherein the driver is an inverter.

16. The lighting system of claim 15 wherein the inverter is configured to provide a relatively constant output frequency and voltage under variable loads.

* * * * *